(12) United States Patent
Matoba et al.

(10) Patent No.: US 11,907,003 B2
(45) Date of Patent: *Feb. 20, 2024

(54) OUTPUT SIGNAL GENERATION CIRCUIT

(71) Applicant: LAPIS Semiconductor Co., Ltd., Yokohama (JP)

(72) Inventors: Kenjiro Matoba, Yokohama (JP); Kazuhiro Yamashita, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/156,148

(22) Filed: Jan. 18, 2023

(65) Prior Publication Data

US 2023/0152839 A1 May 18, 2023

Related U.S. Application Data

(63) Continuation of application No. 17/737,620, filed on May 5, 2022, now Pat. No. 11,567,526, which is a continuation of application No. 17/236,650, filed on Apr. 21, 2021, now Pat. No. 11,347,257, which is a continuation of application No. 16/941,738, filed on Jul. 29, 2020, now Pat. No. 11,009,904, which is a continuation of application No. 15/678,153, filed on Aug. 16, 2017, now Pat. No. 11,068,016.

(30) Foreign Application Priority Data

Aug. 18, 2016 (JP) .................. 2016-160422

(51) Int. Cl.
G06F 1/04 (2006.01)
H03K 19/0185 (2006.01)

(52) U.S. Cl.
CPC ....... G06F 1/04 (2013.01); H03K 19/018521 (2013.01)

(58) Field of Classification Search
CPC .................... G06F 1/04; H03K 19/018521
See application file for complete search history.

(56) References Cited

U.S. PATENT DOCUMENTS

| 7,336,116 B2 | 2/2008 | Hirata et al. |
| 7,490,258 B2 | 2/2009 | Sakamoto et al. |
| 7,667,415 B2 | 2/2010 | Hatano et al. |

(Continued)

FOREIGN PATENT DOCUMENTS

| JP | H02021718 A | 1/1990 |
| JP | H03243033 A | 10/1991 |

(Continued)

Primary Examiner — Patrick O Neill
(74) Attorney, Agent, or Firm — Rabin & Berdo, P.C.

(57) ABSTRACT

An output signal generation circuit includes a first pulse generation circuit configured to receive first information and generate a first pulse signal including the first information, the first pulse signal having a first pulse width that is a minimum pulse width of the first pulse signal, a second pulse generation circuit configured to receive second information and the first pulse signal, and generate a second pulse signal in which the second information is superimposed on the first pulse signal, the second pulse signal having a second pulse width smaller than the first pulse width, and an output circuit configured to output the second pulse signal.

5 Claims, 12 Drawing Sheets

(56) References Cited

U.S. PATENT DOCUMENTS

| | | | |
|---|---|---|---|
| 8,253,682 B2 | 8/2012 | Feng | |
| 8,957,648 B2 | 2/2015 | Wakii et al. | |
| 11,009,904 B2 | 5/2021 | Matoba et al. | |
| 11,068,016 B2 | 7/2021 | Matoba et al. | |
| 11,347,257 B2 | 5/2022 | Matoba et al. | |
| 11,567,526 B2 * | 1/2023 | Matoba | H03K 19/018521 |
| 2018/0054202 A1 | 2/2018 | Matoba et al. | |

FOREIGN PATENT DOCUMENTS

| | | | |
|---|---|---|---|
| JP | 2004355163 A | 12/2004 | |
| JP | 2006211494 A | 8/2006 | |
| JP | 2010257260 A | 11/2010 | |
| WO | 2006080219 A1 | 8/2006 | |

* cited by examiner

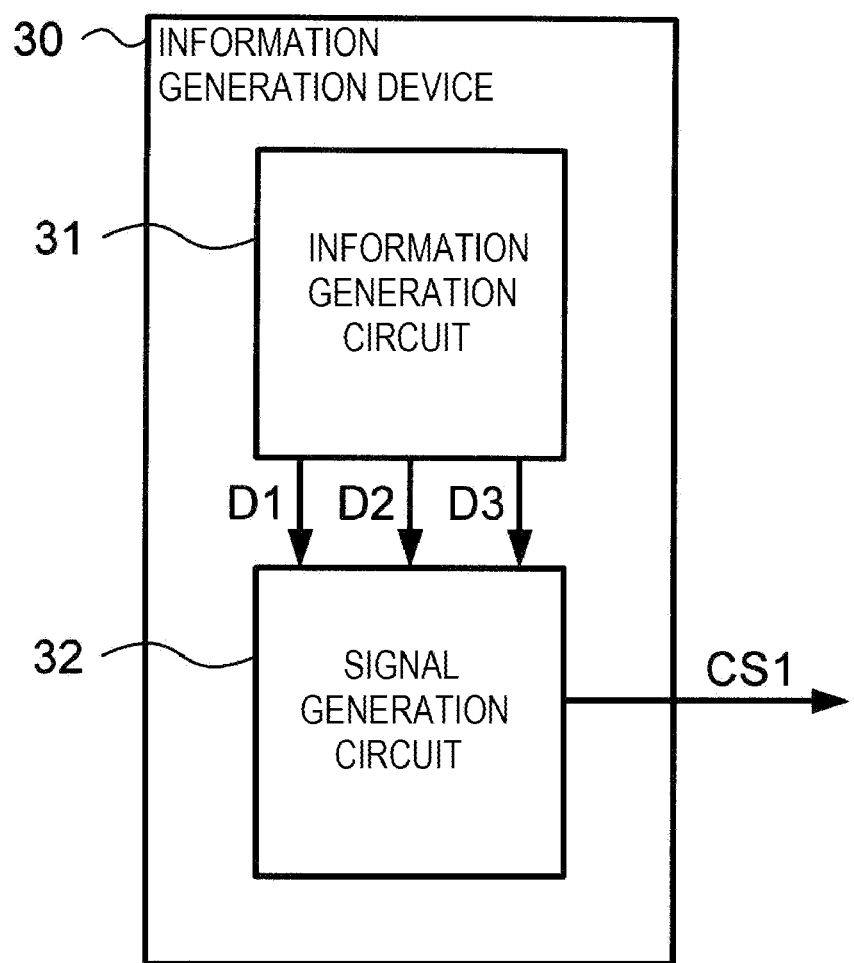

OUTPUT SIGNAL GENERATION CIRCUIT

CROSS REFERENCE TO RELATED APPLICATIONS

This application is a continuation of U.S. application Ser. No. 17/737,620, filed on May 5, 2022, which is a continuation of U.S. application Ser. No. 17/236,650, filed on Apr. 21, 2021 (now U.S. Pat. No. 11,347,257, issued on May 31, 2022), which is a continuation of U.S. application Ser. No. 16/941,738, filed on Jul. 29, 2020 (now U.S. Pat. No. 11,009,904, issued on May 18, 2021), which is a continuation of U.S. application Ser. No. 15/678,153, filed on Aug. 16, 2017 (now U.S. Pat. No. 11,068,016, issued on Jul. 20, 2021), which claims priority from a Japanese Patent Application No. 2016-160422 filed on Aug. 18, 2016, the contents of which are incorporated herein by reference.

BACKGROUND OF THE INVENTION

Technical Field

The present invention relates to an output signal generation circuit that generates an output signal to the outside.

Background Art

In recent years, various devices such as smartphones, household appliances, industrial machinery, and vehicles, for example, have become highly computerized, and can perform complex and precise operations. Such high performance machinery is provided with input devices such as a multiple sensors and buttons, memory, a display, and output devices (functional units) such as speakers or motors. Also, such machinery is provided with a control device that receives various information from the multiple input devices, and controls the operation of the output devices.

The control device is, for example, a microcontroller including a semiconductor integrated circuit connected to the aforementioned input/output devices installed in various types of machinery. The control device receives a signal indicating a specific piece of information from an input device, and then, after performing an operation process, generates a signal to operate an output device and outputs this signal to the output device, for example.

Japanese Patent Application Laid-Open Publication No. 2004-355163 discloses a microcomputer having an interface with an external device, for example. Also, Japanese Patent Application Laid-Open Publication No. 2006-211494 discloses a clock signal supply circuit that supplies a clock signal to a sequential circuit installed in a semiconductor integrated circuit, and a semiconductor system including the same.

SUMMARY OF THE INVENTION

As mentioned above, in recent years, control devices that control the operation of functional units are expected to perform multiple information processes and generate and transmit/receive multiple signals required by such processes. Therefore, when generating a signal indicating information for functional units in the control device or the like, for example, it is expected that signals for a wide range of applications will be generated and outputted.

The present invention takes into consideration such points, and one problem to be resolved by the present invention is to provide an output signal generation circuit that can generate output signals for a wide range of applications including a plurality of pieces of information.

According to an aspect of the invention, there is provided an output signal generation circuit, including a first pulse generation circuit configured to receive first information and generate a first pulse signal including the first information, the first pulse signal having a first pulse width that is a minimum pulse width of the first pulse signal, a second pulse generation circuit configured to receive second information and the first pulse signal, and generate a second pulse signal in which the second information is superimposed on the first pulse signal, the second pulse signal having a second pulse width smaller than the first pulse width, and an output circuit configured to output the second pulse signal.

The output signal generation circuit of the present invention superimposes second information on the first pulse signal including the first information, and generates the second pulse signal, which is one pulse signal including a plurality of pieces of information. Thus, one signal can be outputted for a wide range of applications. Therefore, it is possible to configure an information generation device that generates various information with a few number of signal lines or terminals, for example.

BRIEF DESCRIPTION OF THE DRAWINGS

FIG. 4A is a block diagram showing a configuration of an information generation device according to Embodiment 2.

DETAILED DESCRIPTION OF EMBODIMENTS

Below, embodiments of the present invention will be explained in detail.

Embodiment 1

Figure 1A:
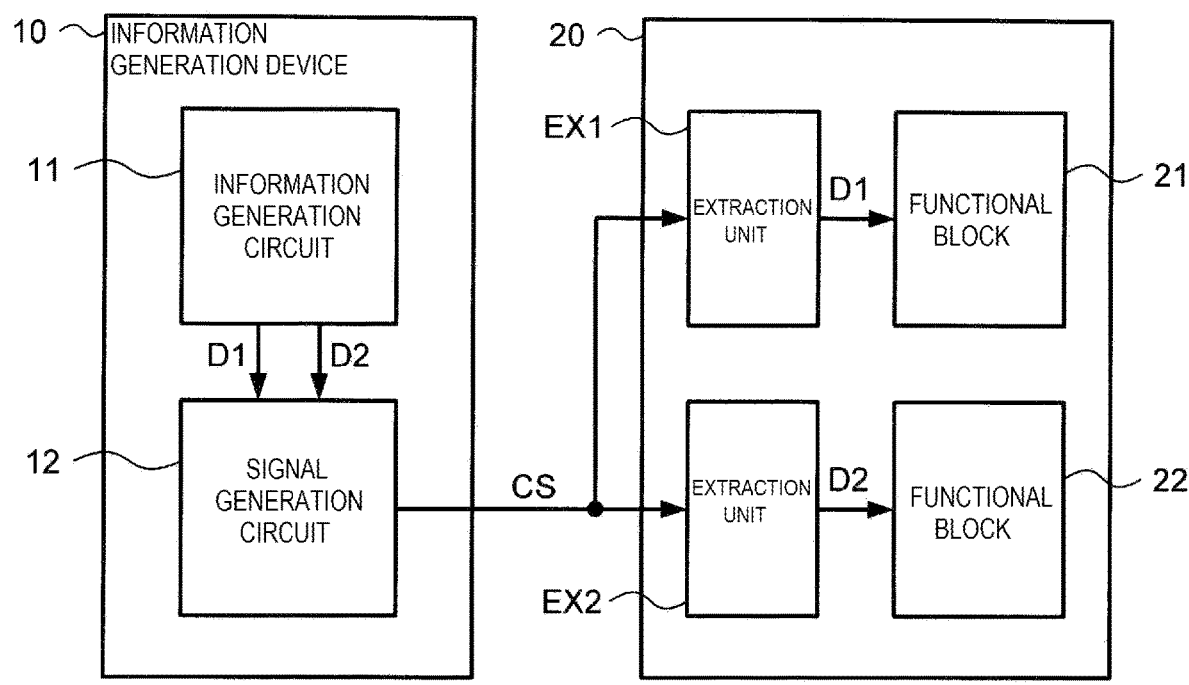
FIG. 1A is a block diagram showing a configuration of an information generation device according to Embodiment 1, and a functional unit connected to the information generation device.

FIG. 1A is a block diagram showing a configuration of an information generation device 10 according to Embodiment 1, and a functional unit 20 connected to the information generation device 10. The information generation device 10 constitutes a microcontroller, for example. The functional unit 20 includes a plurality (two in the present embodiment) of functional blocks 21 and 22. The functional block 21 is a light-emitting element array for a display panel, and the functional block 22 is a speaker, for example. The configuration of the functional blocks 21 and 22 is not limited thereto. The functional blocks 21 and 22 simply need be a circuit block such as a motor, a heater, or a communication device that executes various functions by being driven by the information generation device 10.

The information generation device 10 is configured to perform various processes by acquiring information from input devices such as sensors, counters, and buttons (not shown), for example, and has an information generation circuit 11 that is configured to generate information to operate the functional unit 20. The information generation circuit 11 generates data signals D1 and D2 (first and second data signals) indicating a plurality (two in the present embodiment) of pieces of information. Also, the information generation device 10 has an output signal generation circuit 12 (hereinafter referred to simply as the "signal generation circuit") that is configured to generate a control signal CS (hereinafter referred to as the "output signal") that controls the operation of the functional blocks 21 and 22 of the functional unit 20 on the basis of the data signals D1 and D2 generated by the information generation circuit 11. The signal generation circuit 12 outputs the output signal CS to the functional unit 20.

In the present embodiment, the functional blocks 21 and 22 are provided with extraction units EX1 and EX2 that are configured to receive the output signal CS and extract, respectively, the data signals D1 and D2 from the output signal CS. The functional blocks 21 and 22 operate on the basis of the data signals D1 and D2. That is, the data signal D1 generated by the information generation circuit 11 includes information (first information) for operating the functional block 21, and the data signal D2 includes information (second information) for operating the functional block 22.

Figure 1B:
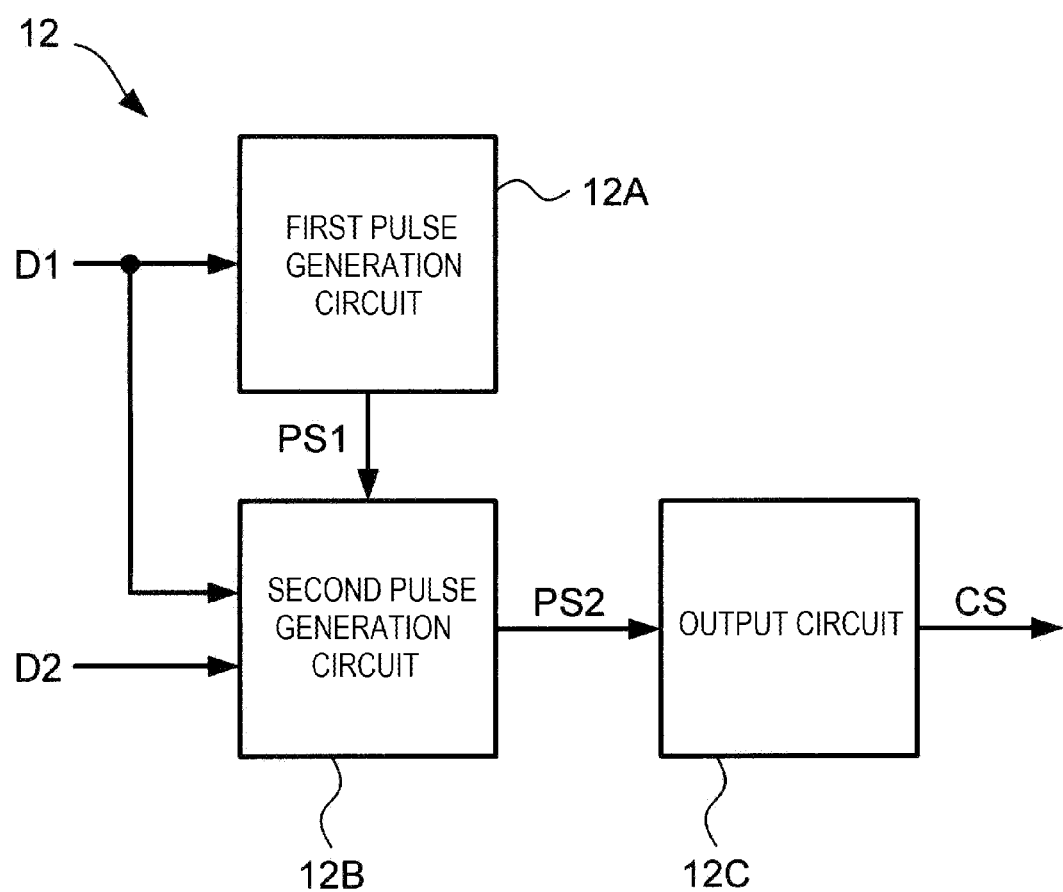
FIG. 1B is a block diagram showing a configuration of an output signal generation circuit according to Embodiment 1.

FIG. 1B is a block diagram showing a configuration of the output signal generation circuit 12. As shown in FIG. 1B, the signal generation circuit 12 has a first pulse generation circuit 12A that is configured to generate a first pulse signal PS1 on the basis of the first data signal D1 (first information), a second pulse generation circuit 12B that is configured to generate a second pulse signal PS2 on the basis of the first pulse signal PS1 and the second data signal D2 (second information), and an output circuit 12C that is configured to generate the output signal CS to output the second pulse signal PS2 to the functional unit 20.

First, the first pulse generation circuit 12A pulses the first data signal D1 and generates the first pulse signal PS1. The first pulse signal PS1 is supplied to the second pulse generation circuit 12B. The second pulse generation circuit 12B pulses the first and second data signals D1 and D2 on the basis of the first data signal D1, the second data signal D2, and the first pulse signal PS1, and generates the second pulse signal PS2. The second pulse signal PS2 is supplied to the output circuit 12C. In the present embodiment, the output circuit 12C selects whether to output or stop outputting the second pulse signal PS2 and generates the output signal CS.

Figure 2:
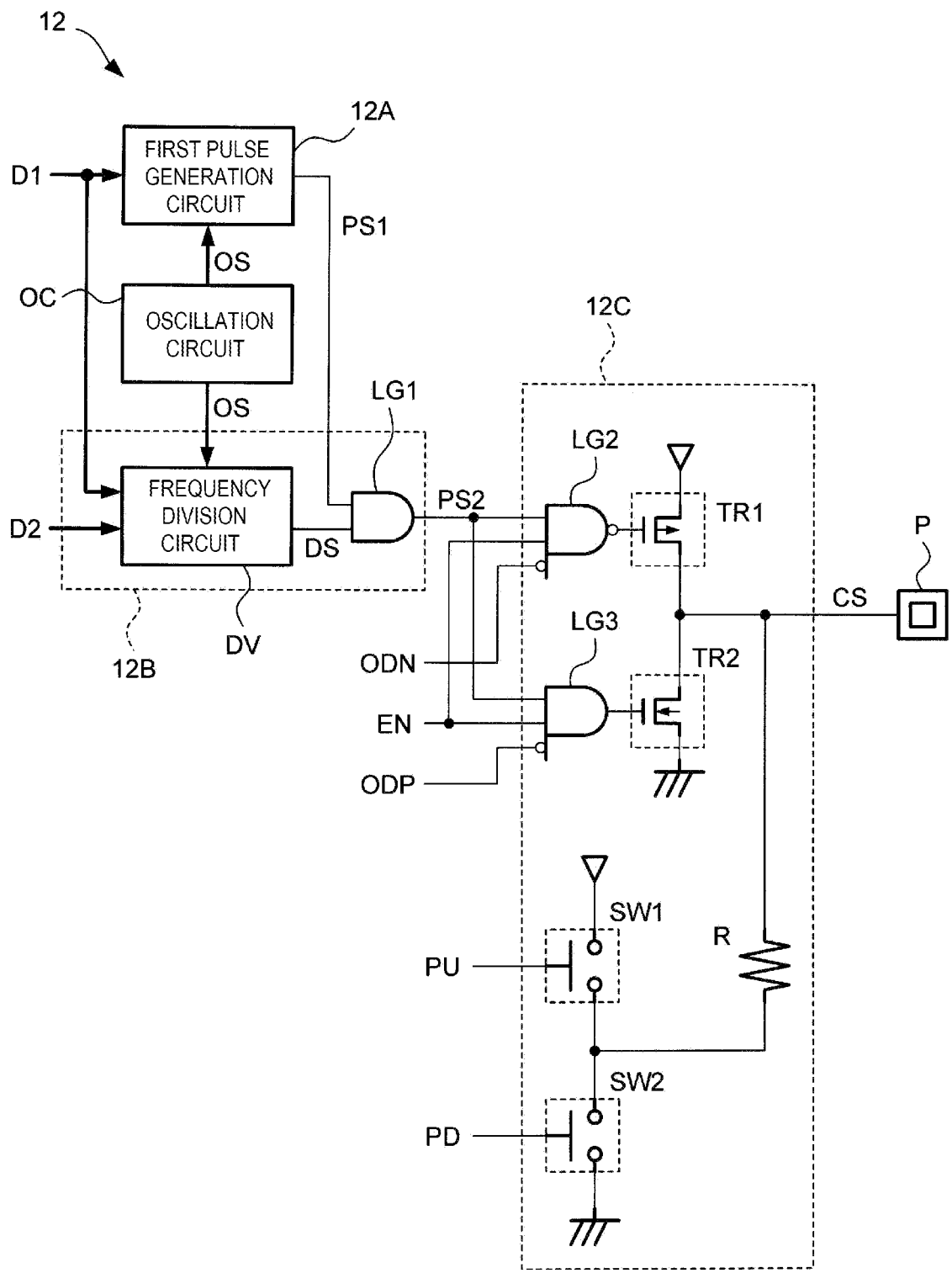
FIG. 2 is a circuit diagram showing a configuration example of the output signal generation circuit according to Embodiment 1.

FIG. 2 is a circuit diagram showing a configuration of the signal generation circuit 12. In the present embodiment, the signal generation circuit 12 controls signals inputted to and outputted from a general purpose input/output (GPIO) port P of the microcontroller. The signal generation circuit 12 is configured so as to generate signals to be outputted from a plurality of ports, but FIG. 2 shows only one port P.

An oscillation signal OS (reference signal) from an oscillation circuit OC is supplied to the pulse generation circuits 12A and 12B of the signal generation circuit 12. Also, the data signal D1 is supplied to the pulse generation circuit 12A. The pulse generation circuit 12A generates the pulse signal PS1 on the basis of the oscillation signal OS and the data signal Dl. In the present embodiment, the pulse generation circuit 12A generates the pulse signal PS1 based on the data signal D1 after performing frequency division on the oscillation signal OS.

The pulse generation circuit 12B has a frequency division circuit DV that is configured to perform frequency division on the oscillation signal OS on the basis of the oscillation signal OS and the data signals D1 and D2, and generate a frequency division signal DS. Also, the pulse generation circuit 12B has an AND circuit LG1 that is configured to output the logical conjunction of the pulse signal PS1 and the frequency division signal DS to generate the pulse signal PS2. The output signal from the AND circuit LG1 is supplied to the output circuit 12C as the pulse signal PS2.

In the present embodiment, the output circuit 12C includes a NAND circuit LG2, an AND circuit LG3, transistors TR1 and TR2, switches SW1 and SW2, and a resistor R. As shown in FIG. 2, the pulse signal PS2, an output enable signal EN, and an N-channel open drain-setting signal ODN are inputted to the NAND circuit LG2. The gate of the transistor TR1 is connected to the output terminal of the NAND circuit LG2.

The pulse signal PS2, the output enable signal EN, and a P-channel open drain-setting signal ODP are inputted to the AND circuit LG3. The gate of the transistor TR2 is connected to the output terminal of the AND circuit LG3. The transistor TR1 is a P-channel MOSFET and the transistor TR2 is an N-channel MOSFET. A power source is connected to the drain of the transistor TR1. The drain of the transistor TR2 is connected to the source of the transistor TR1. The source of the transistor TR2 is grounded. The drain of the transistor TR2 is connected to the port P.

The first terminal of the resistor R is connected to the source of the transistor TR1, and the second terminal of the resistor R is connected to the first terminals of the switches SW1 and SW2. The second terminal of the switch SW1 is connected to the power source, and the second terminal of the switch SW2 is grounded. The switch SW1 is switched between being conductive and being non-conductive by a pull-up setting signal PU. The switch SW2 is switched between being conductive and being non-conductive by a pull-down setting signal PD.

The pulse signal PS2 is supplied selectively to the port P (that is, outputted to the functional unit 20) by the output enable signal EN. Also, the N-channel and P-channel open drain-setting signals ODN and ODP and the pull-up setting signal PU and pull-down setting signal PD are used to control the level of the output signal CS, switch between signal input mode and output mode at the port P, or the like. In this manner, the output circuit 12C performs output control on the pulse signal PS2 and supplies the output signal CS to the port P.

Figure 3:
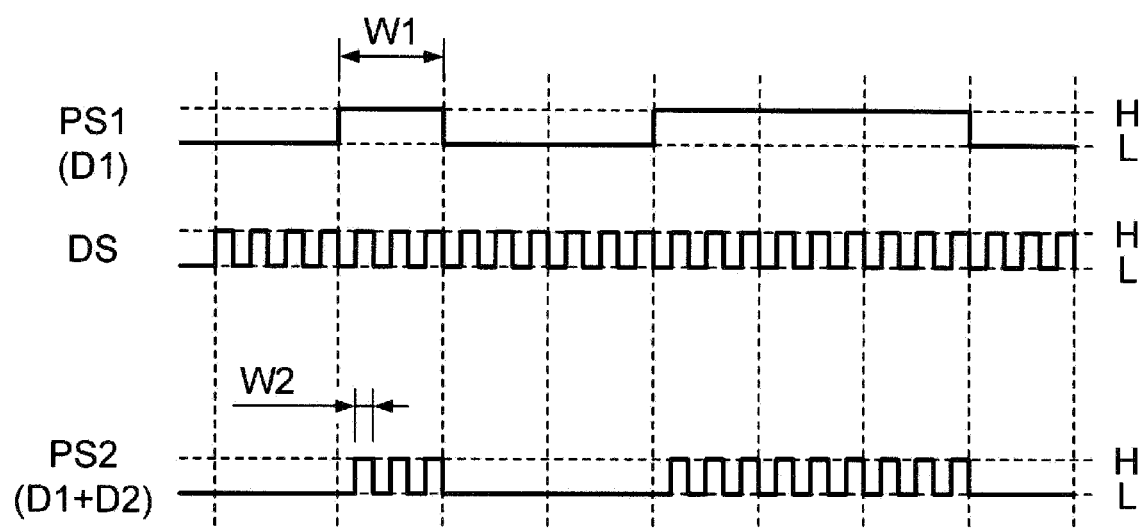
FIG. 3 is a timing chart showing pulse signals outputted from the output signal generation circuit according to Embodiment 1.

FIG. 3 is a timing chart showing pulse signals PS1 and PS2 generated by the signal generation circuit 12. As shown in FIG. 3, the pulse generation circuit 12A outputs the pulse signal PS1 indicating the first information on the basis of the data signal D1. Also, in the present embodiment, the frequency division circuit DV outputs the frequency division signal DS, which is a clock signal with a fixed period generated by performing frequency division on the oscillation signal OS.

Therefore, the pulse signal PS2, which is the logical conjunction of the pulse signal PS1 and the frequency division signal DS, has a waveform such that the frequency division signal DS is outputted when the pulse signal PS1 is at an H level (first logic level). In the present embodiment, the pulse generation circuit 12B generates the pulse signal PS2 in which the frequency division signal DS is outputted when the pulse signal PS1 rises, and output of the frequency division signal DS is stopped when the pulse signal PS1 falls.

In other words, the pulse signal PS2 includes periods when the first data signal D1 is outputted (in the present embodiment, periods in which the pulse signal PS1 is at an L level (second logic level)), and periods when the first and second data signals D1 and D2 are outputted (periods when the pulse signal PS1 is at an H level).

If the narrowest possible pulse width (minimum pulse width) of the pulse signal PS1 is a first pulse width W1, the pulse width of the frequency division signal DS is narrower than the first pulse width W1. In other words, in the present embodiment, the first pulse generation circuit 12A generates the first pulse signal PS1 in which the first pulse width W1 is the minimum pulse width, on the basis of the first information (first data signal D1). Also, the second pulse generation circuit 12B generates the second pulse signal PS2 having a second pulse width W2 that is narrower than the first pulse width W1, and in which the first information and the second information (first and second data signals D1 and D2) are superimposed. Additionally, the output circuit 12C outputs the second pulse signal PS2 as the output signal CS to the outside.

The pulse generation circuit 12A may be configured to selectively pulse a plurality of pieces of information (data signals) to generate the pulse signal PS1 in order to use the port P as the output port for various signals, for example. In such a case, the pulse generation circuit 12A would have a circuit that receives a plurality of data signals D1 from the information generation circuit 11 and pulses them, and a selector (not shown) that selectively outputs the pulsed signals as the pulse signals PS1, for example.

Also, data included in the data signal D1 may be communication data for serial communication, timer data indicating time information counted by a counter, or measurement data measured by a sensor.

Also, in the present embodiment, a case was described in which the output signal CS is supplied to two functional blocks 21 and 22, but the output signal CS is not limited to being supplied thereto. For example, the output signal CS may be supplied to only the functional block 21. In such a case, the output signal CS2 includes two operation parameters of the functional block 21 as data signals D1 and D2, for example. Specifically, in one example, if the functional block 21 is a display panel, then the data signal D1 includes information indicating the light-emitting element to which conduction is enabled, and the data signal D2 includes information indicating the light emission luminance.

In this manner, in the present embodiment, the signal generation circuit 12 has a first pulse generation circuit 12A that generates a first pulse signal PS1 that includes the first information and has the first pulse width W1 as the minimum pulse width, a second pulse generation circuit 12B that generates a second pulse signal PS2 that has a second pulse width W2 that is smaller than the first pulse width W1 and is a signal in which the second information is superimposed on the first pulse signal PS1, and an output circuit 12C that outputs the second pulse signal PS2 as the output signal CS to the outside. Thus, an output signal CS that is compatible with a wide range of applications can be generated.

Also, the pulse signal PS2 (output signal CS) is supplied to the two functional blocks 21 and 22 of the functional unit 20, for example. The functional blocks 21 and 22 are configured so as to extract information used in respective operations thereof from the pulse signal PS2, and operate on the basis of this information. In other words, the signal generation circuit 12 generates one output signal CS that allows the two functional blocks 21 and 22 to operate. Therefore, the signal generation circuit 12 can generate the output signal CS in which signals for operating the plurality of functional blocks 21 and 22 are superimposed. This also enables configuration of an information generation device 10 that performs various types of information generation with a small number of control terminals (small number of ports) and a small number of signal lines.

In the present embodiment, a case was described in which the signal generation circuit 12 generates an output signal CS outputted from the GPIO port, but the signal generation circuit 12 can generate other signals for external output. For example, the output signal CS generated by the signal generation circuit 12 may be a digital signal or an analog signal. If a digital signal is outputted as the output signal CS, for example, then the first pulse width W1 (minimum pulse width) of the pulse signal PS1 generated by the pulse generation circuit 12A corresponds to the clock period (bit period) of the pulse signal PS1.

On the other hand, if an analog signal is outputted as the output signal CS, for example, then the pulse generation circuits 12A and 12B of the signal generation circuit 12 would be configured to generate analog pulse signals as the first and second pulse signals PS1 and PS2. Furthermore, the output circuit 12C would be configured as an element such as an analog switch.

In the present embodiment, a case was described in which the frequency division signal DS is a synchronous signal synchronized to the pulse signal PS1. However, in the case of a configuration in which information is extracted by the functional unit 20, which received the pulse signal PS2, for example, then there is no need for the frequency division signal DS to be synchronized with the pulse signal PS1. The frequency division circuit DV may generate an asynchronous signal that is not synchronized to the pulse signal PS1 as the frequency division signal DS, for example. Regardless of whether the frequency division signal DV is synchronized to the pulse signal PS1, the logical conjunction of the frequency division signal DV and the pulse signal PS1 would be outputted as the pulse signal PS2.

Embodiment 2

FIG. 4A is a block diagram showing a configuration of an information generation device 30 according to Embodiment 2. In the present embodiment, an information generation circuit 31 is configured to generate three data signals D1, D2, D3 (information). Also, a signal generation circuit 32 is configured to generate an output signal CS1 on the basis of the data signals D1, D2, and D3 and output the output signal. The output signal CS1 can be supplied to the functional unit 20 shown in FIG. 1A, for example.

Figure 4B:
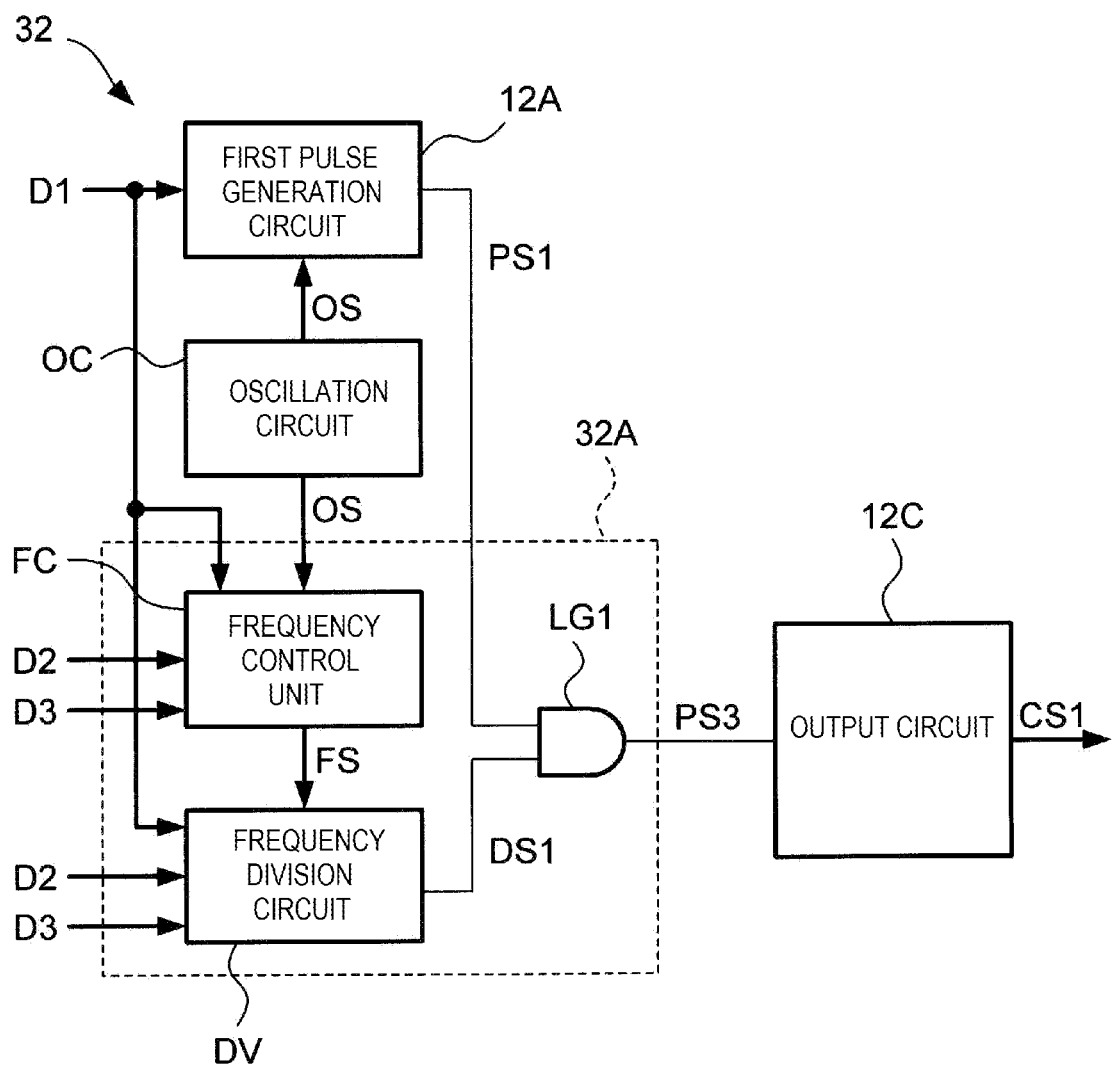
FIG. 4B shows a configuration of an output signal generation circuit according to Embodiment 2.

FIG. 4B shows a configuration of the signal generation circuit 32. The signal generation circuit 32 has a similar configuration to the signal generation circuit 12, other than the configuration of a pulse generation circuit 32A (second pulse generation circuit). The pulse generation circuit 32A has a frequency control unit FC that is configured to control the frequency of the frequency division signal DS1, that is, the frequency division number of the oscillation signal OS, generated by the frequency division circuit DV on the basis of the data signals D1 to D3. The frequency division circuit DV generates a frequency division signal DS1 for frequency division of the oscillation signal OS on the basis of the control signal FS supplied from the frequency control unit FC.

The frequency division signal DS1 generated by the frequency division circuit DV is inputted to the AND circuit LG1 together with the pulse signal PS1 generated by the pulse generation circuit 12A, and is outputted from the AND circuit LG1 as a pulse signal PS3 (second pulse signal). The pulse signal PS3 is supplied to the output circuit 12C, and is outputted to the outside as the output signal CS1.

The data signals D1 to D3 are supplied to the frequency control unit FC. The frequency control unit FC generates a control signal FS (frequency control signal) that controls the frequency division number of the frequency division signal DS1, that is, the frequency of the pulse signal PS3, on the basis of the data signals D1 to D3. Specifically, in the present embodiment, the frequency control unit FC switches the frequency of the pulse signal PS3 between a period during which the data signals D1 and D2 are outputted and a period during which the data signals D1 and D3 are outputted. The frequency control unit FC supplies the control signal FS to the frequency division circuit DV.

Figure 5:
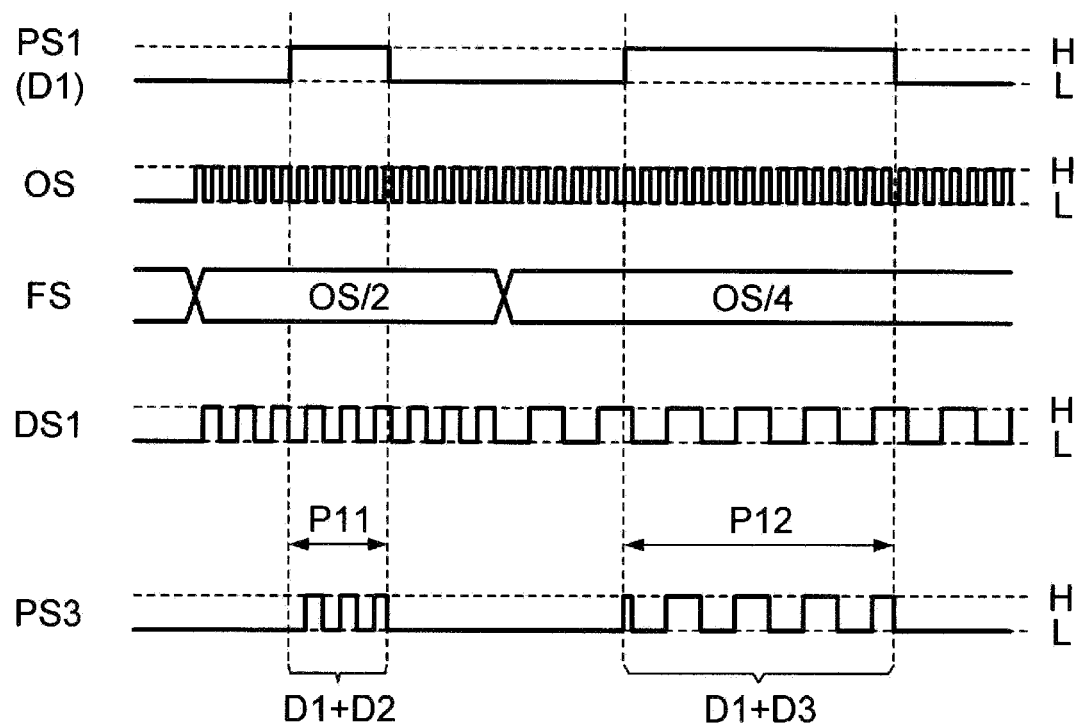
FIG. 5 is a timing chart showing pulse signals outputted from the output signal generation circuit according to Embodiment 2.

FIG. 5 is a timing chart showing the pulse signal PS3 generated by the signal generation circuit 32. In the present embodiment, the frequency control unit FC detects the fall of the pulse signal PS1, and switches the control signal FS during the fall of the pulse signal PS1 or while the pulse signal PS1 is at an L level. In the present embodiment, the frequency control unit FC switches the control signal FS such that the frequency of the pulse signal PS3 differs between the H level periods P11 and P12 of the pulse signal PS1.

Specifically, as shown in FIG. 5, the frequency control unit FC generates the control signal FS such that the frequency division number is ½ during the first H level period P11 of the pulse signal PS1, and ¼ during the second H level period P12. The frequency division circuit DV performs a frequency division of ½ on the oscillation signal OS during the first H level period P11, and, after the first H level period P11, switches the frequency division number to ¼.

Also, as shown in FIG. 5, in the present embodiment the oscillation signal OS generated by the oscillation circuit OC and the pulse signal PS1 generated by the pulse generation circuit 12A are asynchronous signals that are not synchronized with each other. Therefore, the frequency division circuit DV generates an asynchronous signal that is not synchronized to the pulse signal PS1 as the frequency division signal DS1. The pulse signal PS2 is outputted as the logical conjunction of the frequency division signal DS1 and the pulse signal PS1, which are not synchronized to each other.

In this manner, in the present embodiment, the pulse generation circuit 32A has the frequency control unit FC, which controls the frequency of the pulse signal PS3 so as to switch the frequency division number of the frequency division signal DS such that third information is superimposed on the pulse signal PS3. Thus, the pulse generation circuit 32A is configured such that the frequency division circuit DV generates differing frequencies (frequency division numbers) of the frequency division signal DS1. Therefore, the pulse generation circuit 32A generates the pulse signal PS3 having differing frequencies depending on the period.

As a result, it is possible to retain (superimpose) differing information for each period in which the frequency of the pulse signal PS3 differs. Specifically, it is possible to output the pulse signal PS3 so as to include the first and second data signals D1 and D2 (first and second information) during the first H level period P11, and first and third data signals D1 and D3 (first and third information) during the second H level period P12, for example.

Figure 6:
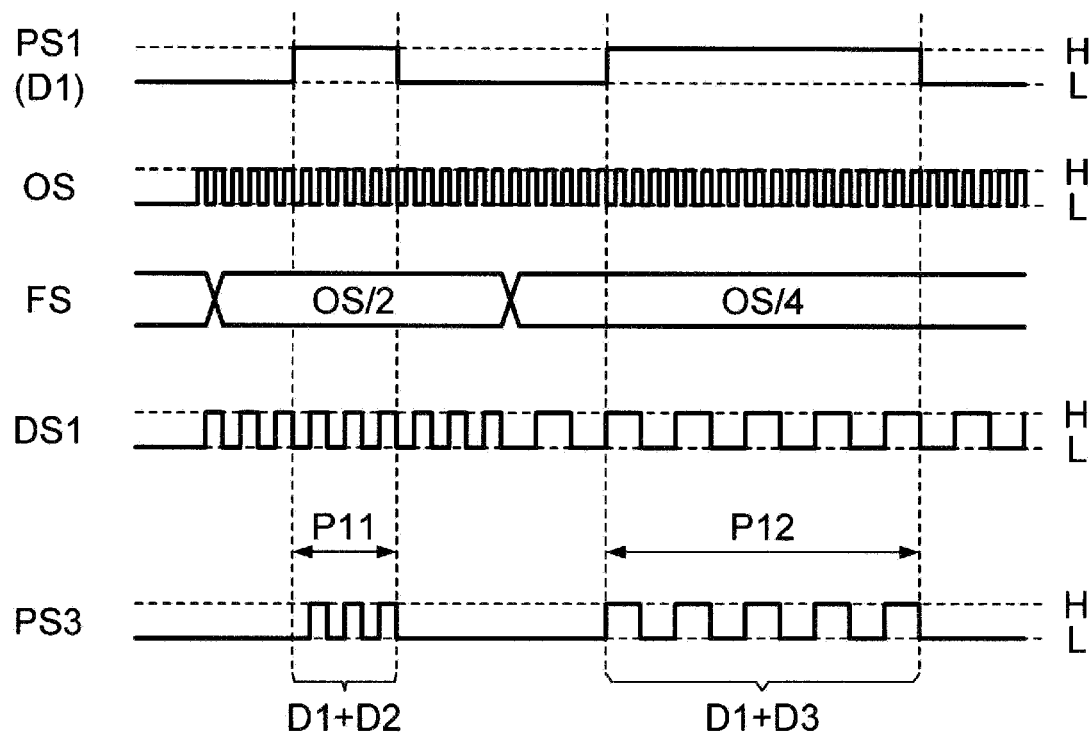
FIG. 6 is a timing chart showing pulse signals outputted from the output signal generation circuit according to Embodiment 2.

As shown in FIG. 6, the oscillation circuit OC and the pulse generation circuit 12A may be configured such that the oscillation signal OS and the pulse signal PS1 are in synchronization with each other. In other words, the frequency division circuit DV may generate a synchronous signal that is synchronized to the pulse signal PS1 as the frequency division signal DS1. Whether or not to synchronize the frequency division signal DS1 with the pulse signal PS1 can be selected according to characteristics of the external device (functional block 21 and the like, for example) receiving the pulse signal PS2.

If extracting information according to the frequency at the external device, for example, the frequency division circuit DV need not generate a frequency division signal DS1 that is synchronized with the pulse signal PS1. If the frequency division circuit DV generates a frequency division signal DS1 that is asynchronous with the pulse signal PS1, there is no need to provide a synchronization circuit or the like in the frequency division circuit DV. Therefore, it is possible to configure the frequency division circuit DV, the pulse generation circuit 32A, and the signal generation circuit 32 with a simple configuration.

Also, in the present embodiment, the pulse width of the pulse signal PS3 differs depending on the period in which the signal is generated, but the pulse width (pulse width corresponding to the pulse width W2 of the pulse signal PS2; see FIG. 3) is narrower than the minimum pulse width W1 of the pulse signal PS1.

In this manner, in the present embodiment, the signal generation circuit 32 generates one pulse signal PS3 based on the third information in addition to the first and second information. Thus, an output signal CS1 that is compatible with a wide range of applications can be generated. This also enables configuration of an information generation device 30 that performs various types of information generation with a small number of signal lines and terminals.

Embodiment 3

Figure 7A:
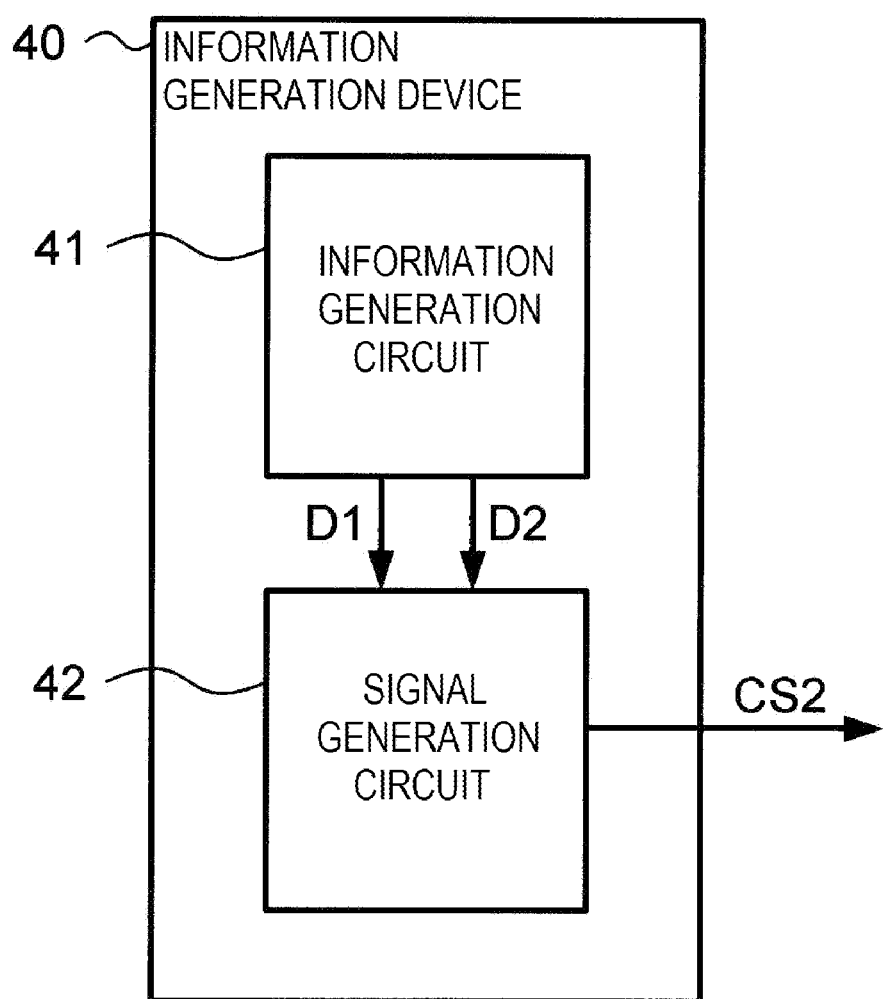
FIG. 7A is a block diagram showing a configuration of an information generation device according to Embodiment 3.

FIG. 7A is a block diagram showing a configuration of an information generation device 40 according to Embodiment 3. The information generation device 40 includes an information generation circuit 41 and a signal generation circuit 42. The signal generation circuit 41 is configured to generate data signals D1 and D2 and supply the signals to the signal generation circuit 42. The signal generation circuit 42 is configured to generate an output signal CS2 on the basis of the data signals D1 and D2, and output the output signal. The output signal CS2 is supplied to the functional unit 20 shown in FIG. 1A, for example.

Figure 7B:
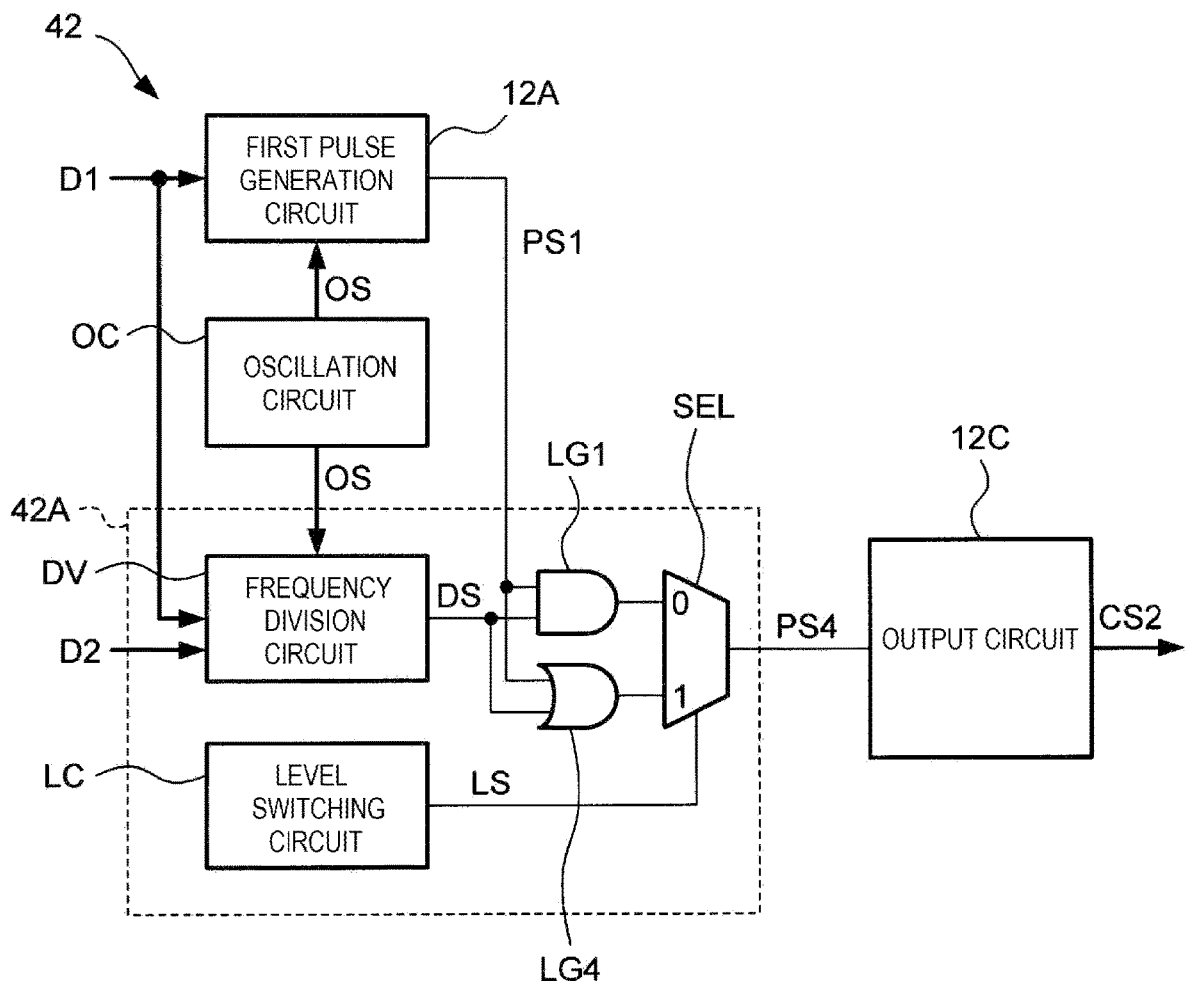
FIG. 7B shows a configuration of an output signal generation circuit according to Embodiment 3.

FIG. 7B shows a configuration of the signal generation circuit 42. The signal generation circuit 42 has a similar configuration to the signal generation circuit 12, other than the configuration of a pulse generation circuit 42A (second pulse generation circuit). The pulse generation circuit 42A generates a pulse signal PS4 (second pulse signal) in which the first information and second information are superimposed on the basis of the first and second data signals D1 and D2, and supplies the pulse signal to the output circuit 12C.

In the present embodiment, the pulse generation circuit 42A has a level switching unit LC that is configured to switch the outputted level of the frequency division signal DS generated by the frequency division circuit DV, an AND circuit LG1, an OR circuit LG4, and a selector SEL. In the present embodiment, the pulse signal PS1 generated by the pulse generation circuit 12A and the frequency division signal DS generated by the frequency division circuit DV are inputted to the AND circuit LG1 and the OR circuit LG4. The OR circuit LG4 is configured to output the logical disjunction of the pulse signal PS1 and the frequency division signal DS.

The input terminals of the selector SEL are connected to the output terminals of the AND circuit LG1 and the OR circuit LG4. Also, the level switching unit LC is connected to the control terminal of the selector SEL. The output terminal of the selector SEL is connected to the output circuit 12C. The level switching unit LC is configured to generate a switching signal LS (level control signal) that switches the output level of the frequency division signal DS and supplies the switching signal to the selector SEL. The signal in which the output level was switched is supplied from the selector SEL to the output circuit 12C as the pulse signal PS4. The output circuit 12C is configured to output the output signal CS2 based on the pulse signal PS4 to the outside.

Figure 8A:
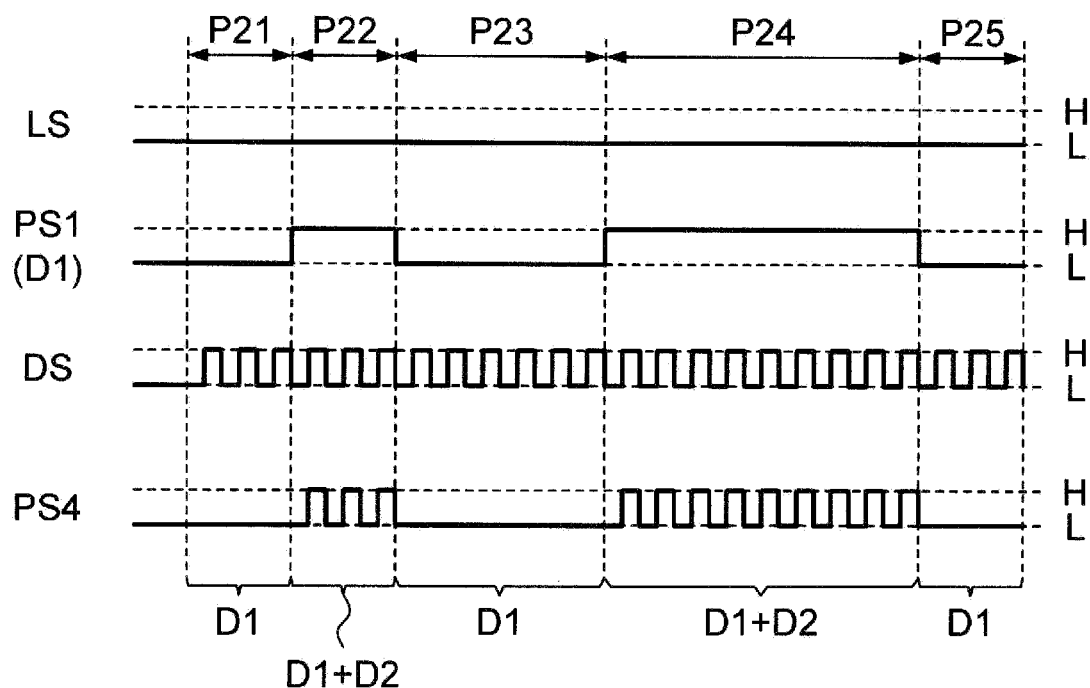
FIGS. 8A and 8B are timing charts showing pulse signals outputted from the output signal generation circuit according to Embodiment 3.
Figure 8B:
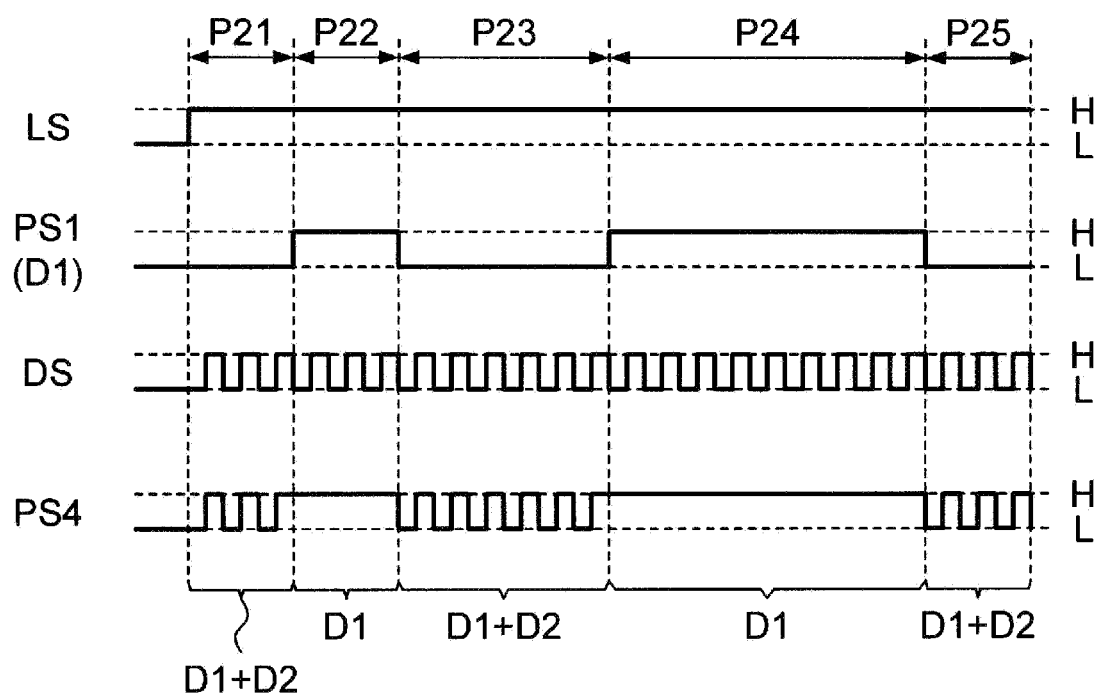

FIGS. 8A and 8B are timing charts showing the pulse signal PS4 generated by the signal generation circuit 42. The pulse signal PS4 generated by the pulse generation circuit 42A changes according to the level of the switching signal LS generated by the level switching unit LC. FIG. 8A shows a timing chart of the pulse signal PS4 for when the switching signal LS is at an L level. FIG. 8B is a timing chart of the pulse signal PS4 for when the switching signal LS is at an H level.

As shown in FIG. 8A, when the switching signal LS is at an L level, a pulse signal PS4 similar to the pulse signal PS2 generated by the signal generation circuit 12 is generated from the signal generation circuit 42. On the other hand, as shown in FIG. 8B, when the switching signal LS is at an H level, the pulse signal PS4 has a waveform in which the frequency division signal DS is outputted when the pulse signal PS1 is at an L level and the pulse signal PS1 is outputted when the pulse signal PS1 is at an H level.

More specifically, in the present embodiment, as shown in FIGS. 8A and 8B, the data periods of the pulse signal PS1 are periods P21, P22, P23, P24, and P25. In this case, as shown in FIG. 8A, if the switching signal LS is at an L level, the periods P22 and P24 are periods during which to output the data signals D1 and D2, and other periods are when the data signal D1 is outputted. On the other hand, as shown in FIG. 8B, if the switching signal LS is at an H level, the periods P21, P23, and P25 are periods during which to output the data signals D1 and D2, and other periods are when the data signal D1 is outputted.

In other words, the level switching unit LC supplies to the selector SEL the switching signal LS, which switches whether, in the pulse signal PS4, to output the frequency division signal DS when the pulse signal PS1 is at a first logic level (H level), or to output the frequency division signal DS when the pulse signal PS1 is at a second logic level (L level).

In this manner, in the present embodiment, level switching for when the pulse signal PS4 is to be superimposed on the second data signal D2 is performed by the level switching unit LC. Therefore, it is possible to generate and output an output signal CS2 for a wide range of applications, and it is possible to configure an information generation device 40 that performs various types of information generation with a small number of signal lines and terminals.

The embodiments above can be combined with each other. For example, the signal generation circuit 42 of Embodiment 3 may be provided with the frequency control unit FC of Embodiment 2. In such a case, the timing for switching the frequency would be during level switching. In other words, if the level switching unit LC outputs the frequency division signal DS when the pulse signal PS1 is at an L level (as shown in FIG. 8B), the frequency control unit FC would control the switching timing of the control signal FS such that the frequency division number is switched when the pulse signal PS1 rises.

As described above, the signal generation circuit of the present invention has a first pulse generation circuit 12A that generates a first pulse signal PS1 that indicates the first information, a second pulse generation circuit 12B (32A, 42A) that generates a second pulse signal PS2 (PS3, PS4) that has a pulse width that is smaller than the first pulse signal PS1 on the basis of the first information and the second information, and an output circuit 12C that outputs the second pulse signal PS2 as the output signal CS. Thus, the output signal CS, which is compatible with a wide range of applications, can be generated and outputted.

What is claimed is:

1. An information generation device, comprising:
an information generation circuit configured to generate a first data signal including first information and a second data signal including second information; and
an output signal generation circuit including a first pulse generation circuit that receives the first data signal and generates a first pulse signal including the first information, a second pulse generation circuit that receives the second data signal and the first pulse signal and generates a second pulse signal in which the second information is superimposed on the first pulse signal, and an output circuit that outputs the second pulse signal.

2. The information generation device according to claim 1, wherein
the first pulse signal has a first pulse width that is a minimum pulse width of the first pulse signal, and
the second pulse signal has a second pulse width smaller than the first pulse width.

3. The information generation device according to claim 1, wherein the second pulse generation circuit includes:
a frequency division circuit configured to perform frequency division on a reference signal to generate a frequency division signal,
an AND circuit configured to output, as the second pulse signal, a logical conjunction of the first pulse signal and the frequency division signal,
an OR circuit configured to output a logical disjunction of the first pulse signal and the frequency division signal, and
a selector connected between output terminals of the AND circuit and the OR circuit, and the output circuit, the selector being configured to select an output of the AND circuit or an output of the OR circuit, and to output the selected output to the output circuit.

4. The information generation device according to claim 3, wherein the second pulse generation circuit further includes a level switching circuit configured to supply to the selector a switching signal that determines whether to output the frequency division signal in the second pulse signal when the first pulse signal is at a first logic level, or when the first pulse signal is at a second logic level.

5. A semiconductor system comprising:
  the information generation device according to claim 1, and
  a functional unit configured to be connected to the information generation device and receive the second pulse signal,
  wherein the information generation circuit is configured to generate the first information and the second information to operate the functional unit.

\* \* \* \* \*